(12) United States Patent
Moon

(10) Patent No.: US 10,885,989 B1
(45) Date of Patent: Jan. 5, 2021

(54) DATA STORAGE APPARATUS AND INTERNAL VOLTAGE TRIMMING CIRCUIT AND METHOD FOR TRIMMING AN INTERNAL VOLTAGE

(71) Applicant: SK hynix Inc., Icheon-si (KR)

(72) Inventor: Young Jin Moon, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/806,644

(22) Filed: Mar. 2, 2020

(30) Foreign Application Priority Data

Aug. 23, 2019 (KR) .......................... 10-2019-0103569

(51) Int. Cl.
*G11C 16/30* (2006.01)
*H03F 3/45* (2006.01)
*G11C 29/50* (2006.01)
*G11C 16/04* (2006.01)

(52) U.S. Cl.
CPC .............. *G11C 16/30* (2013.01); *G11C 29/50* (2013.01); *H03F 3/45* (2013.01); *G11C 16/0483* (2013.01); *G11C 2029/5004* (2013.01); *H03F 2203/45156* (2013.01); *H03F 2203/45332* (2013.01)

(58) Field of Classification Search
CPC ..... G11C 16/30; G11C 29/50; G11C 16/0483; G11C 2029/5004; H03F 3/45; H03F 2203/45156; H03F 2203/45332
USPC ..................................................... 365/210.12
See application file for complete search history.

(56) References Cited

U.S. PATENT DOCUMENTS

| 6,201,733 | B1 * | 3/2001 | Hiraki | G11C 16/06 365/185.08 |
| 6,324,103 | B2 * | 11/2001 | Hiraki | G11C 7/08 365/189.05 |
| 6,341,090 | B1 * | 1/2002 | Hiraki | G11C 16/06 365/185.08 |
| 7,031,217 | B2 * | 4/2006 | Hiraki | G11C 7/08 365/185.08 |

(Continued)

FOREIGN PATENT DOCUMENTS

| KR | 100909251 B1 | 7/2009 |
| KR | 101027501 B1 | 4/2011 |
| KR | 1020170044342 A | 4/2017 |

*Primary Examiner* — Harry W Byrne
(74) *Attorney, Agent, or Firm* — William Park & Associates Ltd.

(57) ABSTRACT

A data storage apparatus includes storage and a controller configured to control the storage in response to a request from a host. The controller includes an internal voltage trimming circuit which includes: an integration circuit configured to generate an integration signal by integrating a difference between a test voltage output from a device under test (DUT) and a reference voltage; a comparison circuit configured to generate a comparison signal by comparing the integration signal and the reference voltage; a transition detection circuit configured to output a detection signal according to level transition of the comparison signal; a counter configured to receive an initial trimming code and generate a preliminary trimming code by increasing or reducing the initial trimming code in response to the detection signal; and an average circuit configured to generate a final trimming code by averaging the preliminary trimming code for a determined time interval and provide the final trimming code to the storage.

15 Claims, 13 Drawing Sheets

(56) References Cited

U.S. PATENT DOCUMENTS

2001/0002884 A1* 6/2001 Hiraki .............. G11C 29/50012
365/185.09
2006/0023548 A1* 2/2006 Hiraki ...................... G11C 7/22
365/222

* cited by examiner

DATA STORAGE APPARATUS AND INTERNAL VOLTAGE TRIMMING CIRCUIT AND METHOD FOR TRIMMING AN INTERNAL VOLTAGE

CROSS-REFERENCES TO RELATED APPLICATION

The present application claims priority under 35 U.S.C. § 119(a) to Korean application number 10-2019-0103569, filed on Aug. 23, 2019, in the Korean Intellectual Property Office, which is incorporated herein by reference in its entirety.

BACKGROUND

1. Technical Field

Various embodiments may generally relate to a semiconductor integrated device, and more particularly, to a data storage apparatus and an interval voltage trimming circuit and method for trimming an internal voltage.

2. Related Art

Semiconductor devices operate by internal voltages which are generated using an external voltage supplied from the outside and need to generate accurate internal voltages for stable operation. The internal voltages may be generated to desired levels, for example, through trimming.

External test equipment outside the semiconductor device may be used for voltage trimming. However, because the time required for a test using the external test equipment is directly related to test cost, an embedded test device called a built-in self-test (BIST) device has been introduced.

BIST is for trimming a voltage to a target level through an internal circuit of a semiconductor device and reduces the test time and cost.

Even when a trimming code fluctuates frequently, the accurate trimming code generation is a factor which affects operation reliability of the semiconductor device.

SUMMARY

In accordance with an embodiment of the present disclosure, a data storage apparatus may include storage and a controller configured to control the storage in response to a request from a host. The controller includes an internal voltage trimming circuit which is includes include: an integration circuit configured to generate an integration signal by integrating a difference between a test voltage output from a device under test (DUT) and a reference voltage; a comparison circuit configured to generate a comparison signal by comparing the integration signal and the reference voltage; a transition detection circuit configured to output a detection signal in response to level transition of the comparison signal; a counter configured to receive an initial trimming code and generate a preliminary trimming code by increasing or reducing the initial trimming code; and an average circuit configured to generate a final trimming code by averaging the preliminary trimming code for a determined time interval and provide the final trimming code to the storage.

In accordance with an embodiment of the present disclosure is an internal voltage trimming circuit configured to provide a trimming code for generating an internal voltage of a semiconductor device. The internal voltage trimming circuit may include: an integration circuit configured to generate an integration signal by integrating a difference between a test voltage output from a device under test (DUT) and a reference voltage; a comparison circuit configured to generate a comparison signal by comparing the integration signal and the reference voltage; a transition detection circuit configured to output a detection signal in response to level transition of the comparison signal; a counter configured to receive an initial trimming code and generate a preliminary trimming code by increasing or reducing the initial trimming code in response to the detection signal; and an average circuit configured to generate a final trimming code by averaging the preliminary trimming code for a determined time interval and provide the final trimming code to the semiconductor device.

In accordance with an embodiment of the present disclosure, a trimming method performed by an internal voltage trimming circuit for generating an internal voltage of a semiconductor device may include: generating an integration signal by integrating a difference between a test voltage output from a device under test (DUT) and a reference voltage; generating a comparison signal by comparing the integration signal and the reference voltage; outputting a detection signal in response to level transition of the comparison signal; generating a preliminary trimming code by increasing or reducing an initial trimming code in response to the detection signal; and generating a final trimming code by averaging the preliminary trimming code for a determined time interval and providing the final trimming code to the semiconductor device.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present teachings are described in detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments of the present teachings. However, embodiments of the present teachings should not be construed as limiting the present teachings. Although a few embodiments of the present teachings are shown and described, it will be appreciated by those of ordinary skill in the art that changes may be made in these embodiments without departing from the principles and spirit of the present teachings.

Figure 1:
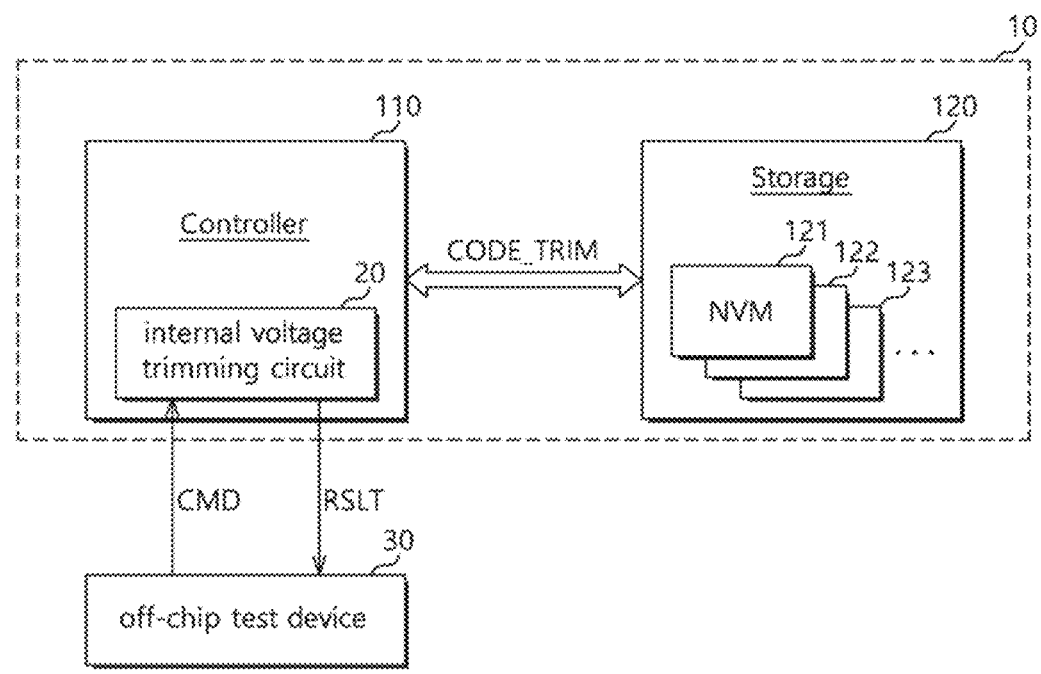
FIG. 1 is a diagram illustrating a configuration of a data storage apparatus according to an embodiment of the present disclosure.

FIG. 1 is a diagram illustrating a configuration of a data storage apparatus according to an embodiment.

Referring to FIG. 1, a data storage apparatus 10 may include a controller 110 and storage 120 and may operate according to control of a host (not shown).

The controller 110 may control the storage 120 in response to a request of the host. For example, the controller 110 may control data to be programmed in the storage 120 in response to a write request from the host. The controller 110 may provide data stored in the storage 120 to the host in response to a read request from the host.

The storage 120 may store data or output stored data according to control of the controller 110. The storage 120 may be configured of a volatile or nonvolatile memory device. In an embodiment, the storage 120 may be implemented using a memory device selected among various nonvolatile memory devices such as an electrically erasable and programmable read only memory (EEPROM), a NAND flash memory, a NOR flash memory, a phase-change random access memory (PRAM), a resistive RAM (ReRAM), a ferroelectric RAM (FRAM), a spin torque transfer magnetic RAM (STT-MRAM), and the like. The storage 120 may include a plurality of nonvolatile memory devices (NVMs) 121, 122, 123, . . . . The nonvolatile memory device (NVM) may include a plurality of dies, a plurality of chips, or a plurality of packages. The storage 120 may operate as a single-level cell (SLC) in which one-bit data is to be stored in one memory cell or a multi-level cell in which multi-bit data is to be stored in one memory cell.

The storage 120 may generate an internal voltage by receiving an internal voltage trimming code CODE_TRIM from the controller 110 to perform a program, erase, or read operation according to control of the controller 110.

The controller 110 may include an internal voltage trimming circuit 20.

The internal voltage trimming circuit 20 may be coupled to an off-chip test device 30, which is an external tester in some embodiments. The internal voltage trimming circuit 20 may perform a test operation such as an operation of generating the internal voltage trimming code CODE_TRIM in response to a test command CMD of the off-chip test device 30 and provide a test result RSLT to the off-chip test device 30.

In an embodiment, the internal voltage trimming circuit 20 may be implemented in a BIST device type and embedded in the inside of the controller 110. Accordingly, various tests including the internal voltage trimming operation may be performed on-chip. The internal voltage trimming circuit 20 may provide the off-chip test device 30 with the test result RSLT after the completion of the trimming operation.

The internal voltage trimming code CODE_TRIM determined through the internal voltage trimming circuit 20 may be stored in control logic of the storage 120 and may be used for the internal operations of the storage 120 such as the program, erase, and read operations.

Figure 2:
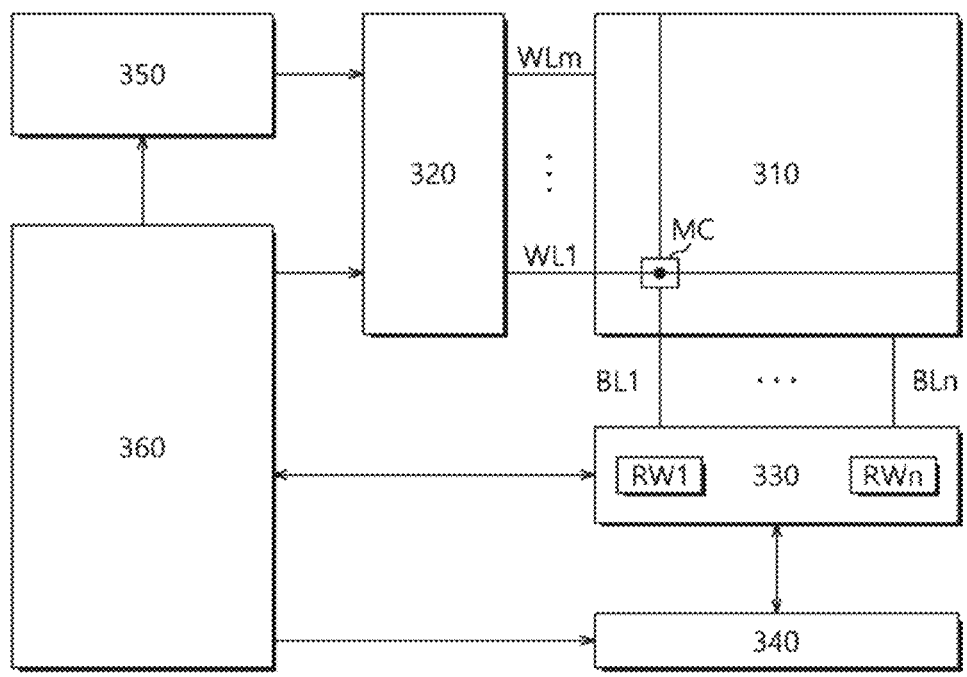
FIG. 2 is a diagram illustrating a configuration of a nonvolatile memory device included in a data storage apparatus according to an embodiment of the present disclosure.

FIG. 2 is a diagram illustrating a configuration of a nonvolatile memory device 300 included in a data storage apparatus according to an embodiment.

Referring to FIG. 2, the nonvolatile memory device 300 may include a memory cell array 310, a row decoder 320, a data read/write block 330, a column decoder 340, a voltage generator 350, and control logic 360.

The memory cell array 310 may include memory cells MC which are arranged in regions where word lines WL1 to WLm and bit lines BL1 to BLn cross each other.

The memory cell array 310 may include a three-dimensional (3D) memory array. The 3D memory array may refer to an array structure including a NAND string having a directivity perpendicular to one surface of a semiconductor substrate, that at least one memory cell is vertically located over another memory cell. However, the 3D memory array is not limited thereto and any memory array highly integrated in a vertical directivity as well as a horizontal directivity may be selectively adapted to the 3D memory array.

The row decoder 320 may be coupled with the memory cell array 310 through the word lines WL1 to WLm. The row decoder 320 may operate according to control of the control logic 360. The row decoder 320 may decode addresses provided from an external device (not shown). The row decoder 320 may select and drive the word lines WL1 to WLm, based on the decoding results. For example, the row decoder 320 may provide word line voltages provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. In another example, the data read/write block 330 may operate as a sense amplifier which reads out data from the memory cell array 310 in a read operation.

The column decoder 340 may operate according to control of the control logic 360. The column decoder 340 may decode addresses provided from the external device. The column decoder 340 may couple data input/output lines (or data input/output buffers) with the read/write circuits RW1 to RWn of the data read/write block 330 which respectively correspond to the bit lines BL1 to BLn, based on decoding results.

The voltage generator 350 may generate voltages used for operations of the nonvolatile memory devices 300. The voltages generated by the voltage generator 350 may be applied to the memory cells MC of the memory cell array 310. For example, a program voltage generated in a program operation may be applied to a word line of memory cells on which the program operation is to be performed. In another example, an erase voltage generated in an erase operation may be applied to a well region of memory cells on which the erase operation is to be performed. In still another example, a read voltage generated in a read operation may be applied to a word line of memory cells on which the read operation is to be performed.

The control logic 360 may control an overall operation of the nonvolatile memory device 300, based on control signals provided from the external device. For example, the control logic 360 may control the read, write, and erase operations of the nonvolatile memory device 300. The control logic 360 may be implemented as hardware, software, or a combination of hardware and software. For example, the control logic 360 may be a control logic circuit operating in accordance with an algorithm and/or a processor executing control logic code.

The trimming code CODE_TRIM provided from the controller 110 may be stored in read-only memory (ROM) inside the control logic 360 and the voltage generator 350 may generate an internal voltage based on the trimming code CODE_TRIM.

In an embodiment, the internal voltage trimming circuit 20 may integrate a difference between an output voltage of a device under test (DUT) and a reference voltage, compare an integrated result with the reference voltage, and increase or reduce the trimming code according to a comparison result. The internal voltage trimming circuit 20 may generate a final trimming code by averaging the trimming code output for a determined time interval.

In an embodiment, the interval voltage trimming circuit 20 may use an offset cancelled integrator to exclude influence due to external noise and fluctuations of process variables. The internal voltage trimming circuit 20 may allow the response characteristic of the integration circuit to converge near a reference voltage level by adding a zero or pole to the integration circuit so that the fluctuation rate of the trimming code may be minimized.

Figure 3:
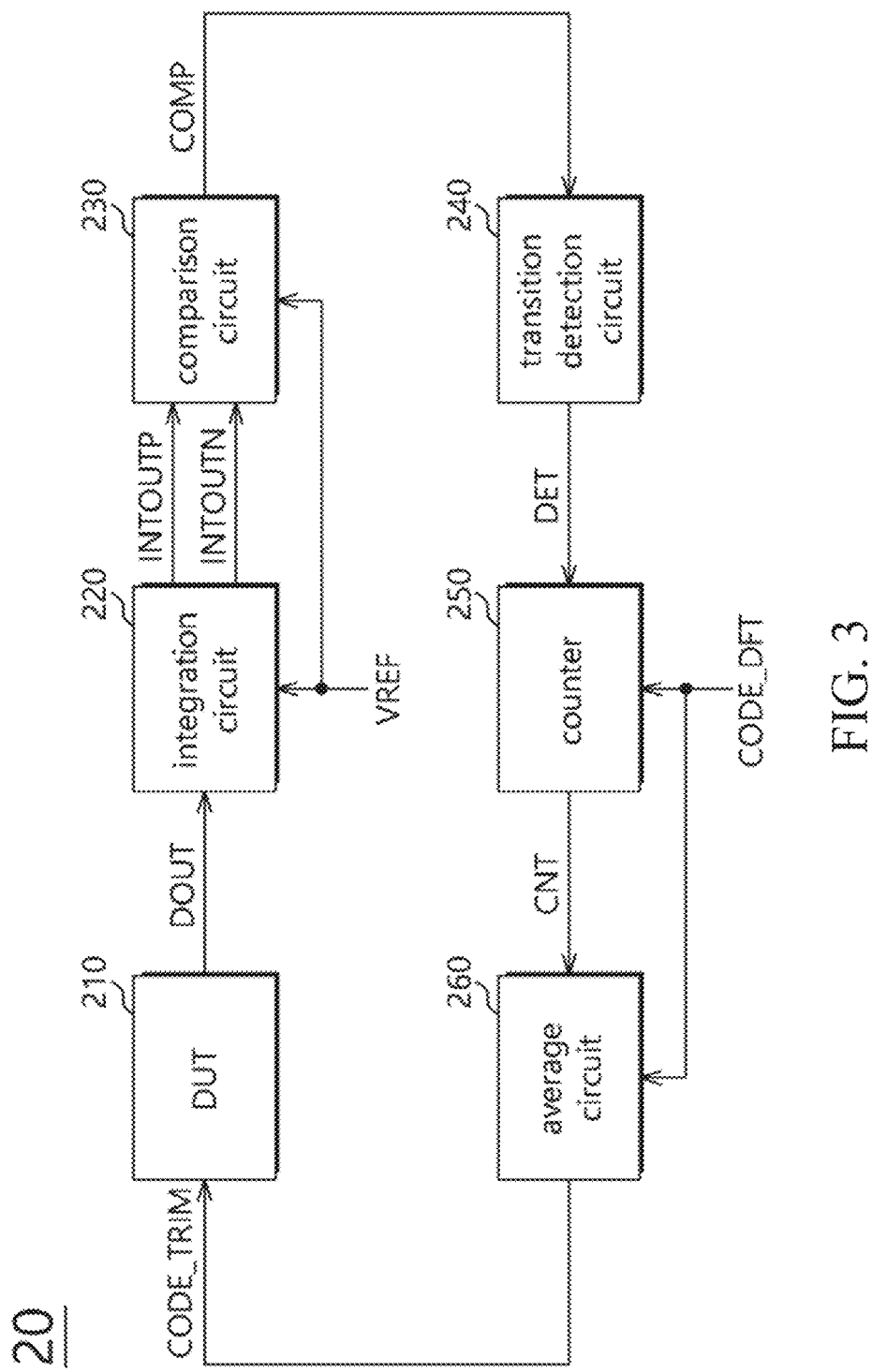
FIG. 3 is a diagram illustrating a configuration of an internal voltage trimming circuit according to an embodiment of the present disclosure.

FIG. 3 is a diagram illustrating a configuration of an internal voltage trimming circuit 20 according to an embodiment.

Referring to FIG. 3, the internal voltage trimming circuit 20 according to an embodiment may include a DUT 210, an integration circuit 220, a comparison circuit 230, a transition detection circuit 240, a counter 250, and an average circuit 260.

The DUT 210 may be configured to output a test voltage DOUT in response to the trimming code CODE_TRIM.

The integration circuit 220 may be configured to integrate a difference between the test voltage DOUT output from the DUT 210 and a reference voltage VREF.

In an embodiment, the integration circuit 220 may be configured to receive differential input signals generated from the test voltage DOUT and generate differential integration signals INTOUTP and INTOUTN, but this is not limited thereto.

The comparison circuit 230 may be configured to receive the differential integration signals INTOUTP and INTOUTN provided from the integration circuit 220 and generate a comparison signal COMP by comparing the differential integration signals INTOUTP and INTOUTN and the reference voltage VREF.

The transition detection circuit 240 may be configured to receive the comparison signal COMP and output a detection signal DET when a level of the comparison signal COMP is transited.

The counter 250 may be configured to receive an initial trimming code CODE_DFT and output a count signal CNT, which is a preliminary trimming code in other points of view, by increasing or reducing the initial trimming code CODE_DFT in response to the detection signal DET.

The average circuit 260 may be configured to generate a final trimming code CODE_TRIM by averaging the count signal CNT output from the counter 250 for a determined time interval.

According to an embodiment, the counter 250 might not increase or reduce the trimming code CODE_TRIM in response to every clock signal but may increase or reduce the trimming code CODE_TRIM when the output signal COMP of the comparison circuit 230 is transited, so that the frequent fluctuation of the trimming code CODE_TRIM may be mitigated or prevented.

Accordingly, because the trimming code CODE_TRIM is maintained to a specific level for a determined time interval, the trimming code CODE_TRIM with no error may be generated even when the trimming code CODE_TRIM is collected and averaged for a short time.

Figure 4:
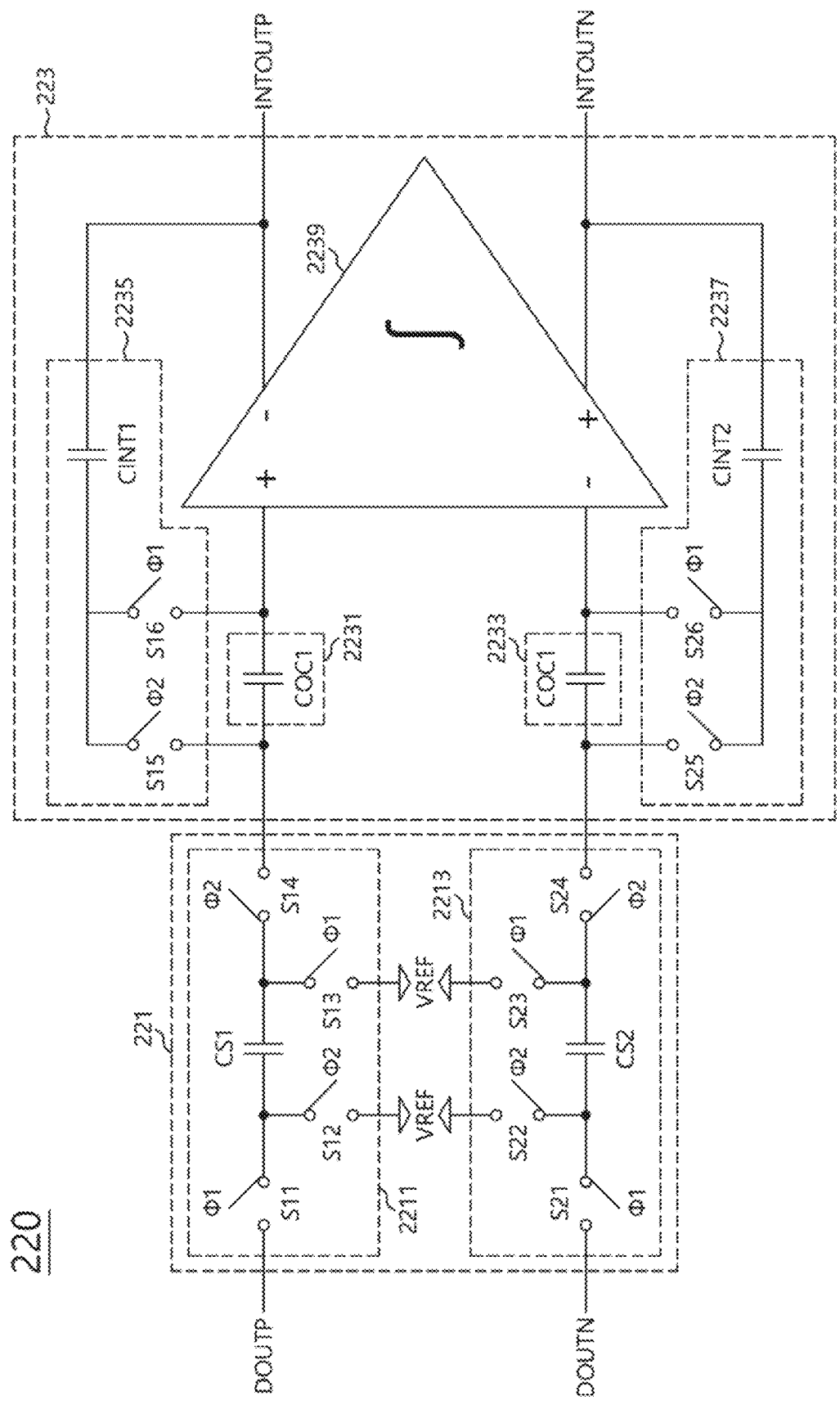
FIG. 4 is a diagram illustrating a configuration of an integration circuit according to an embodiment of the present disclosure.

In an embodiment, the integration circuit 220 may use an offset cancelled integrator to exclude influence due to external noise and fluctuations of process variables when comparing the output voltage DOUT of the DUT 210 and the reference voltage VREF and may be configured, for example, as in FIG. 4.

FIG. 4 is a diagram illustrating a configuration of an integration circuit 220 according to an embodiment.

Referring to FIG. 4, the integration circuit 220 may include a sampling unit 221 and an amplifying integration unit 223.

The sampling unit 221 may be configured to: receive a positive (+) input signal DOUTP, a negative (−) input signal DOUTN, and the reference voltage VREF; sample the positive (+) input signal DOUTP and the negative (−) input signal in response to a first control signal φ1 and a second control signal φ2; and output sampling signals to the amplifying integration unit 223.

The amplifying integration circuit 223 may be configured to integrate the sampling signals output from the sampling unit 221 and output integrating results to a positive (+) output terminal INTOUTN and a negative (−) output terminal INTOUTP.

Referring to FIG. 4, the sampling unit 221 may include a first sampling switch S11 coupled to the positive (+) input terminal DOUTP and driven in response to the first control signal φ1, a first output switch S12 coupled between the first sampling switch S11 and a reference voltage VREF input terminal and driven in response to the second control signal φ2, a first sampling capacitor CS1 of which one terminal is coupled to the first sampling switch S11, a second sampling switch S13 coupled between the other terminal of the first sampling capacitor CS1 and the reference voltage VREF input terminal and driven in response to the first control signal φ1, and a second output switch S14 coupled to the other terminal of the first sampling capacitor CS1 and driven in response to the second control signal φ2. The first sampling switch S11, the first output switch S12, the first sampling capacitor CS1, the second sampling switch S13, and the second output switch S14 may constitute a first sampling unit 2211.

The sampling unit 221 may further include a third sampling switch S21 coupled to the negative (−) input terminal DOUTN and driven in response to the first control signal φ1, a third output switch S22 coupled between the third sampling switch S21 and the reference voltage VREF input terminal and driven in response to the second control signal φ2, a second sampling capacitor CS2 of which one terminal is coupled to the third sampling switch S21, a fourth sampling switch S23 coupled between the other terminal of the second sampling capacitor CS2 and the reference voltage VREF input terminal and driven in response to the first control signal φ1, and a fourth output switch S24 coupled to the other terminal of the second sampling capacitor CS2 and driven in response to the second control signal φ2. The third sampling switch S21, the third output switch S22, the second sampling capacitor CS2, the fourth sampling switch S23, and the fourth output switch S24 may constitute a second sampling unit 2213.

The first control signal φ1 and the second control signal φ2 may be signals having clock phases such that high level intervals are alternately repeated and non-overlapping.

Accordingly, the differences between the input signals DOUTP and DOUTN and the reference voltage VREF may be sampled through the first and second sampling capacitors CS1 and CS2 during the high level interval of the first control signal φ1. The voltages sampled through the first and second sampling capacitors CS1 and CS2 may be transferred and integrated to and in the amplifying integration unit 223 during the high level interval of the second control signal φ2.

The amplifying integration unit 223 may include a first offset cancellation unit 2231, a second offset cancellation unit 2233, a first integration unit 2235, a second integration unit 2237, and an amplification unit 2239.

The first integration unit 2235 may include a fifth output switch S15 coupled to an output terminal of the first sampling unit 2211 and driven in response to the second control signal φ2, a first integration capacitor CINT1 coupled between the fifth output switch S15 and the negative (−) output terminal INTOUTP of the amplification unit 2239, and a fifth sampling switch S16 coupled between a positive (+) input terminal of the amplification unit 2239 and the first integration capacitor CINT1 and driven in response to the first control signal φ1.

The first offset cancellation unit 2231 may include a first offset cancellation capacitor COC1 of which one terminal is coupled to the output terminal of the first sampling unit 2211 and the other terminal is coupled to the positive (+) input terminal of the amplification unit 2239.

The second integration unit 2237 may include a sixth output switch S25 coupled to an output terminal of the second sampling unit 2213 and driven in response to the second control signal φ2, a second integration capacitor CINT2 coupled between the sixth output switch S25 and the positive (+) output terminal INTOUTN of the amplification unit 2239, and a sixth sampling switch S26 coupled between a negative (−) input terminal of the amplification unit 2239 and the second integration capacitor CINT2 and driven in response to the first control signal φ1.

The second offset cancellation unit 2233 may include a second offset cancellation capacitor COC2 of which one terminal is coupled to the output terminal of the second sampling unit 2213 and the other terminal is coupled to the negative (−) input terminal of the amplification unit 2239.

The amplification unit 2239 may have a differential output including an inverting output signal INTOUTP and a non-inverting output signal INTOUTN. Noise may be generated in proportion to the differential output and thus the effect due to the external noise may be mitigated or eliminated.

The malfunction due to the fluctuations of the process variables may be compensated through the first and second offset cancellation capacitors COC1 and COC2 arranged in the input terminals of the amplification unit 2239.

Figure 5:
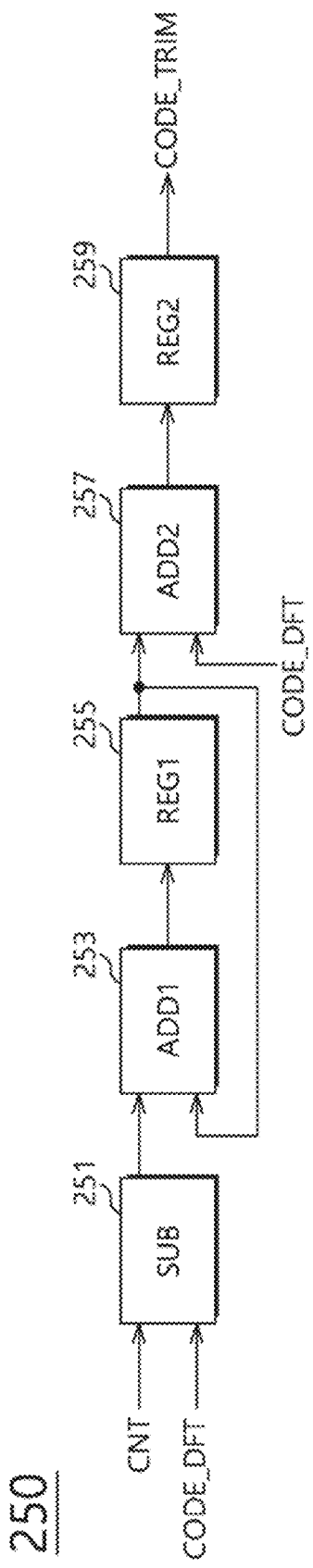
FIG. 5 is a diagram illustrating a configuration of an average circuit according to an embodiment of the present disclosure.

FIG. 5 is a diagram illustrating a configuration of an average circuit 250 according to an embodiment.

Referring to FIG. 5, the average circuit 250 may include a subtractor 251, a first adder 253, a first register 255, a second adder 257, and a second register 259.

The subtractor 251 may detect a difference between the initial trimming code CODE_DFT and the count signal CNT.

The first adder 253 may be configured to add an output signal of the subtractor 251 and an output signal of the first register 255 for a preset time.

The first register 255 may store an output signal of the first adder 253.

The second adder 257 may be configured to add the output signal of the first register 255 and the initial trimming code CODE_DFT.

The second register 259 may store the final trimming code CODE_TRIM which is an output signal of the second adder 257 and transmit the final trimming code CODE_TRIM to the DUT 210 and the storage 120.

Figure 6:
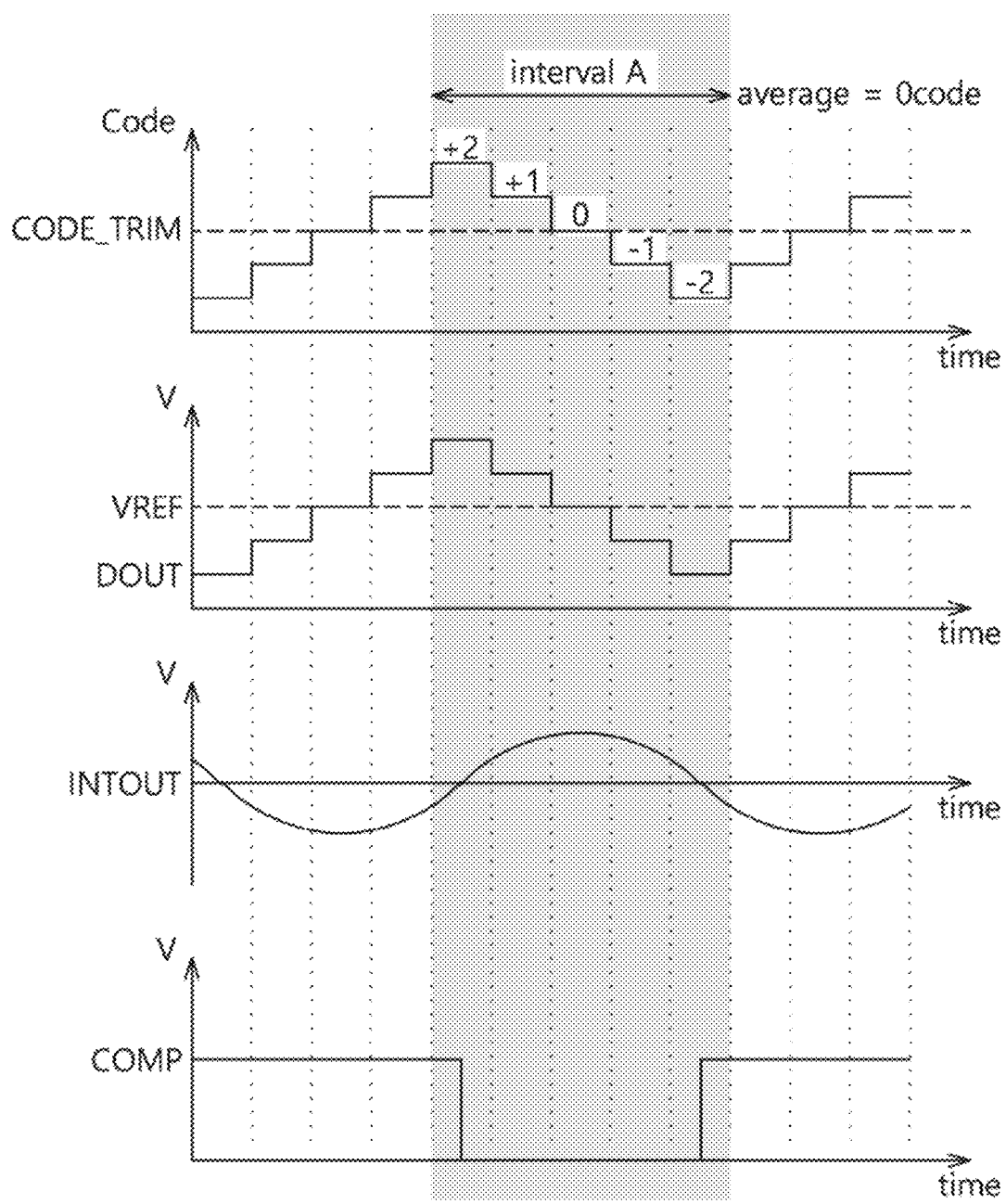
FIGS. 6 to 8 are timing diagrams for describing trimming code generating methods according to embodiments of the present disclosure.
Figure 7:
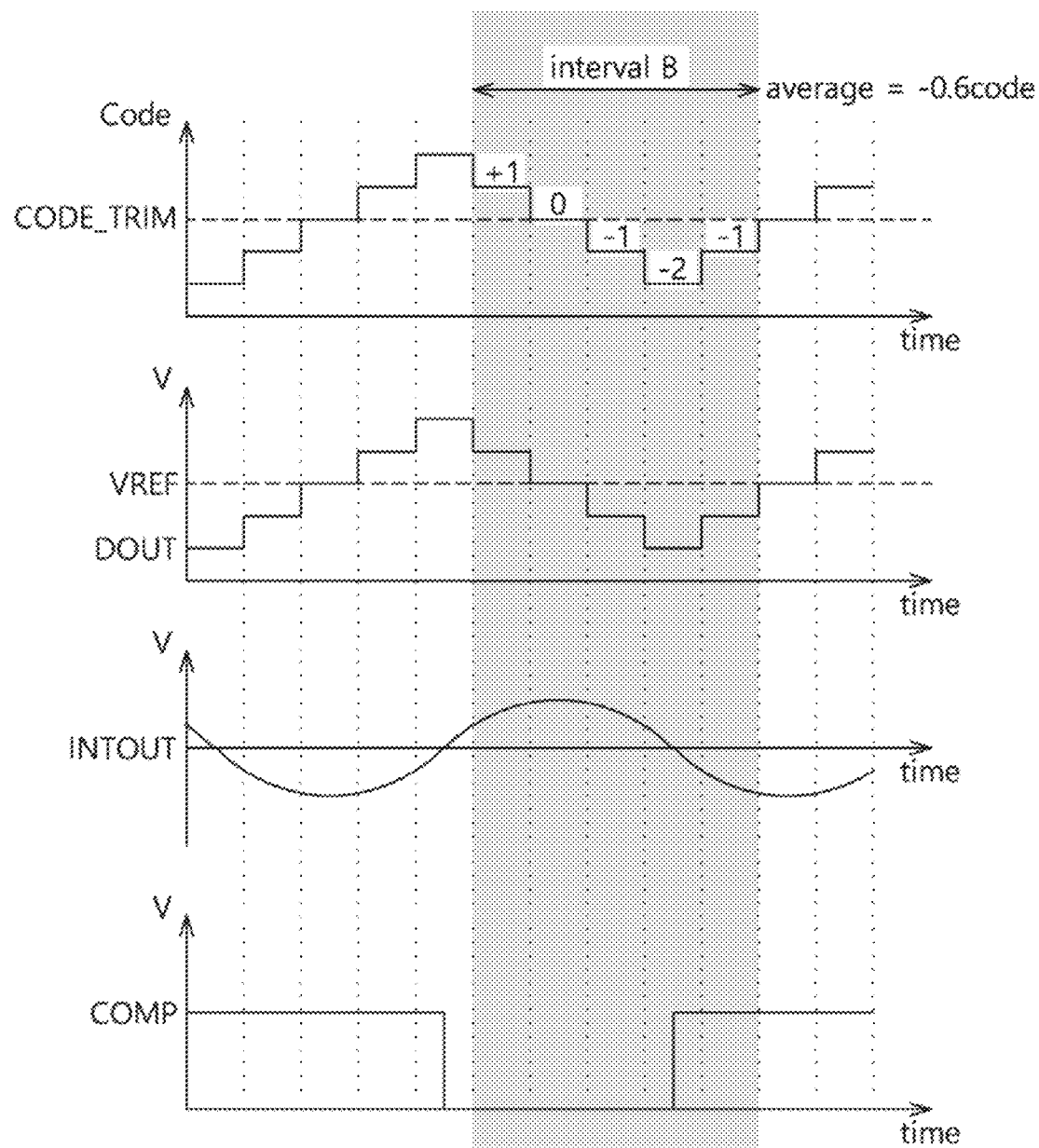
Figure 8:
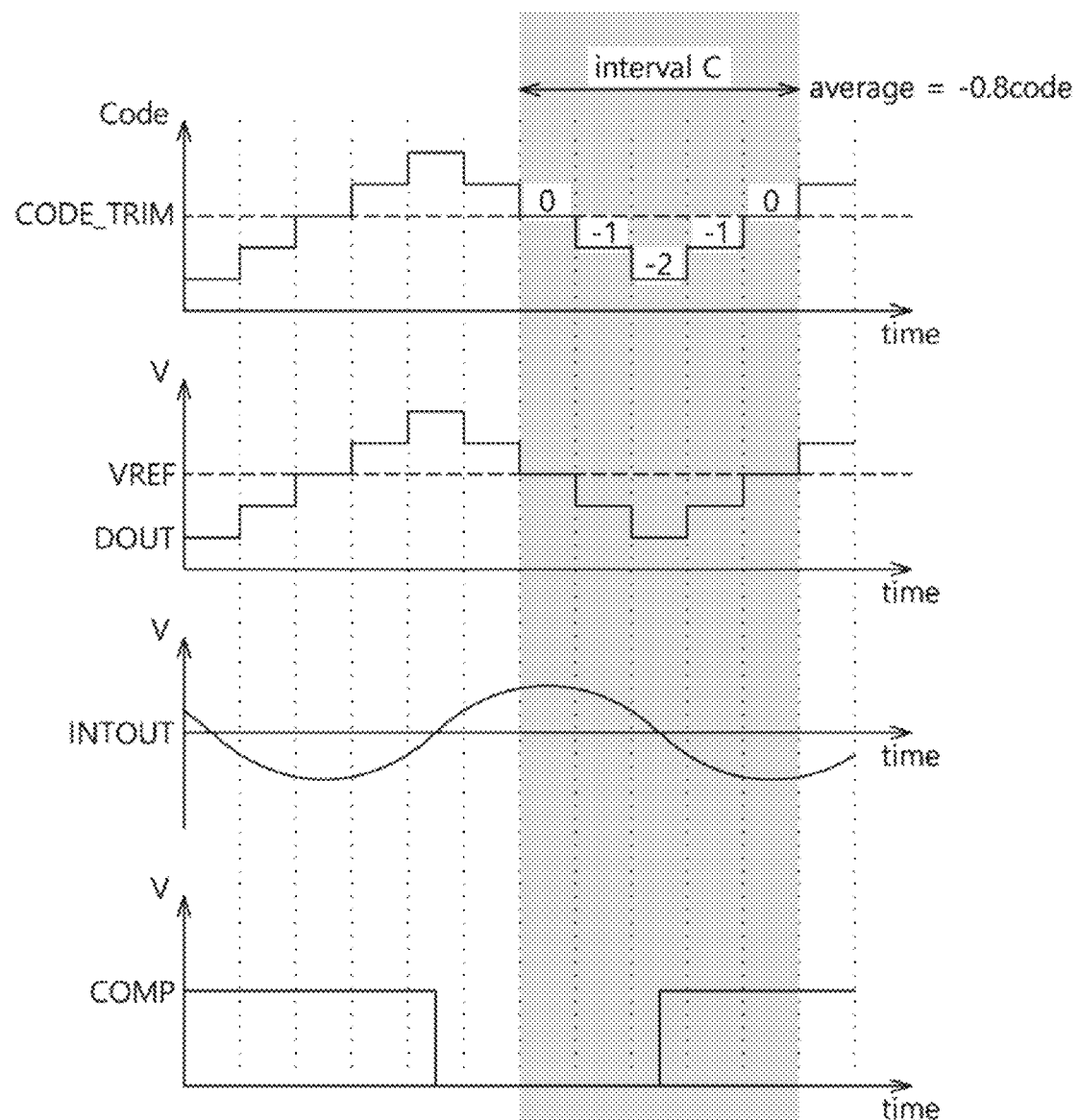

FIGS. 6 to 8 are timing diagrams for describing trimming code generating methods according to embodiments.

Referring to FIGS. 6 to 8, when the trimming is started, the test voltage DOUT may be output from the DUT 210 according to the initial trimming code CODE_DFT and the integration circuit 220 may receive the test voltage DOUT and the reference voltage VREF and output the integration signal INTOUT by integrating the difference between the test voltage DOUT and the reference voltage VREF.

The comparison circuit 230 may compare the output signal of the integration circuit 220 and the reference voltage VREF. The comparison circuit 230 may output the comparison signal COMP having a logic high level when the test voltage DOUT is lower than the reference voltage VREF and the output of the integration circuit 220 falls. The comparison circuit 230 may output the comparison signal COMP having a logic low level when the test voltage DOUT is higher than the reference voltage VREF and the output of the integration circuit 220 rises.

When the comparison signal COMP is reflected to the trimming code CODE_TRIM in response to every clock signal, the counter 250 may reduce the trimming code CODE_TRIM by 1 code in response to the low-level comparison signal COMP and increase the trimming code CODE_TRIM by 1 code in response to the high-level comparison signal COMP.

The average circuit 260 may generate the final trimming code CODE_TRIM by averaging the preliminary trimming code CNT output from the counter 250 for a determined time interval.

When the trimming code CODE_TRIM is changed in response to every clock signal, the code fluctuates frequently as illustrated in FIGS. 6 and 7. Therefore, an error may occur when the code is averaged for a short interval. When the code is averaged for a long interval to solve the problem, a long time may be necessary to generate the trimming code and a circuit size may be increased.

For example, because the preliminary trimming code is collected and averaged for a long interval A as illustrated in FIG. 6, the time and cost required to generate the trimming code may be increased.

For example, when the preliminary trimming code is collected and averaged for an interval B as illustrated in FIG. 7, the time and cost required to generate the trimming code may be increased. Further, when a result that needs to be rounded is obtained, a code error may be caused.

Figure 9:
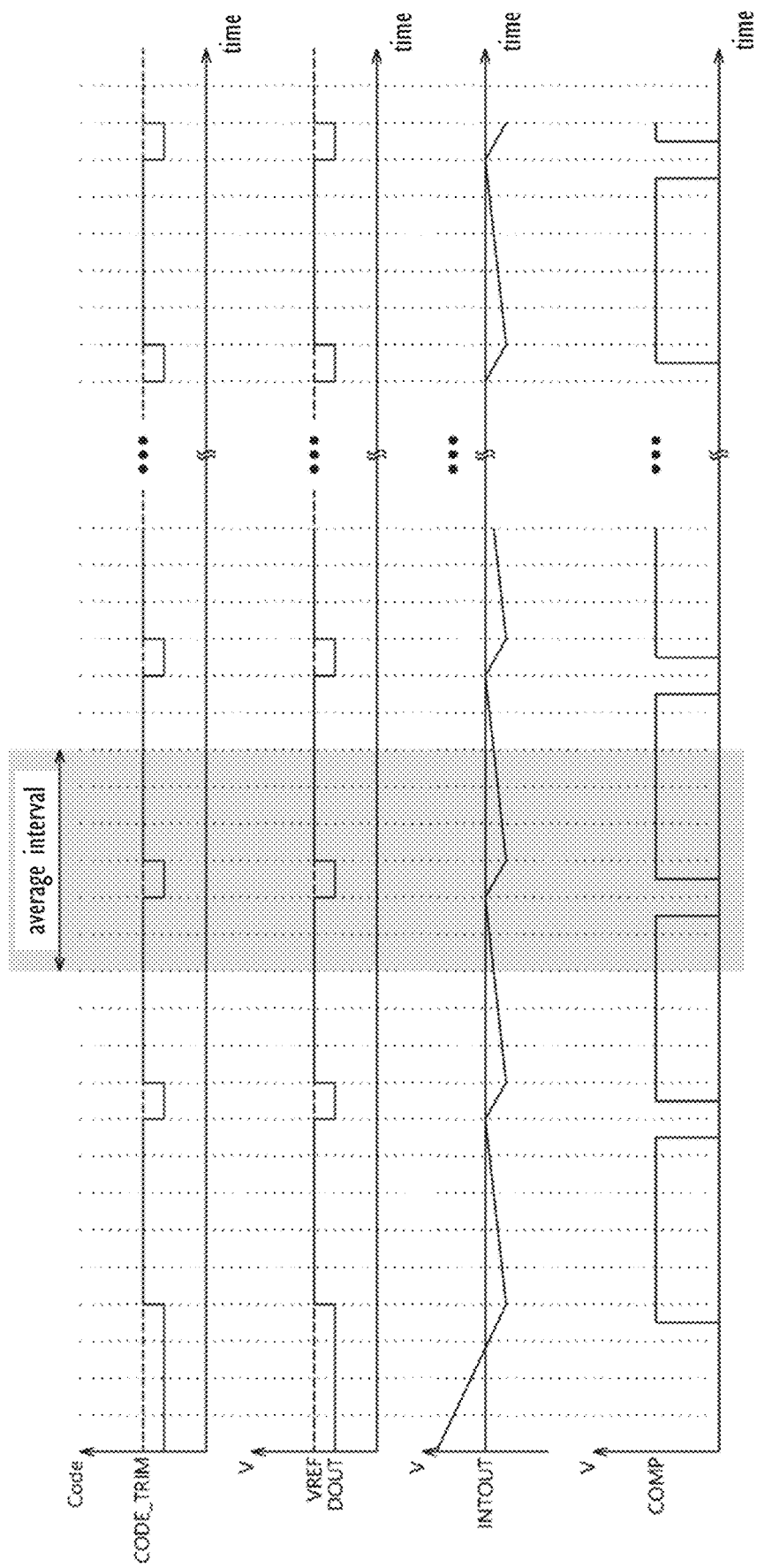
FIG. 9 is a diagram for describing a trimming code generating method according to an embodiment of the present disclosure.

FIG. 9 is a diagram for describing a trimming code generating method according to an embodiment.

The present technology might not increase and reduce the trimming code CODE_TRIM every clock signal and may change the trimming code CODE_TRIM in response to transition of the output signal of the comparison circuit.

Referring to FIG. 9, when the test voltage DOUT is lower than the reference voltage VREF and the output INTOUT of the integration circuit 220 falls to a specific level or less, the high-level comparison signal COMP may be output from the comparison circuit 230. When the test voltage DOUT is higher than the reference voltage VREF and the output of the integration circuit 220 rises, the output signal of the comparison circuit 230 may be transited to a low level.

The transition detection circuit 240 may detect transition of the output signal of the comparison circuit 230 and the counter 250 may increase or reduce the trimming code CODE_TRIM when the transition of the output signal of the comparison circuit 230 is detected. The average circuit 260 may generate the final trimming code CODE_TRIM by averaging the trimming code CODE_TRIM for a determined time interval.

Figure 10:
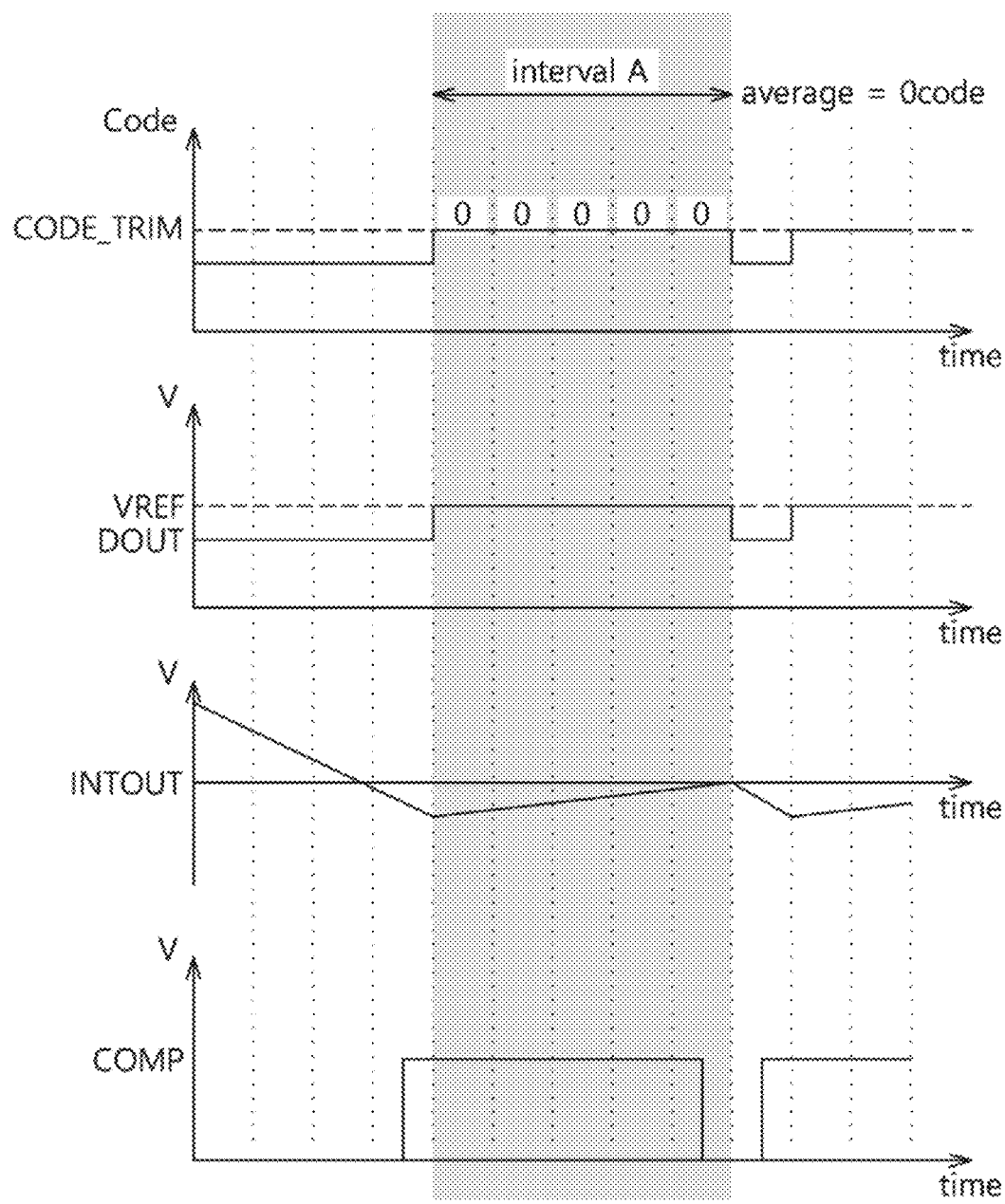
FIGS. 10, 11, and 12 are timing diagrams for describing to trimming code generating methods according to embodiments of the present disclosure.
Figure 11:
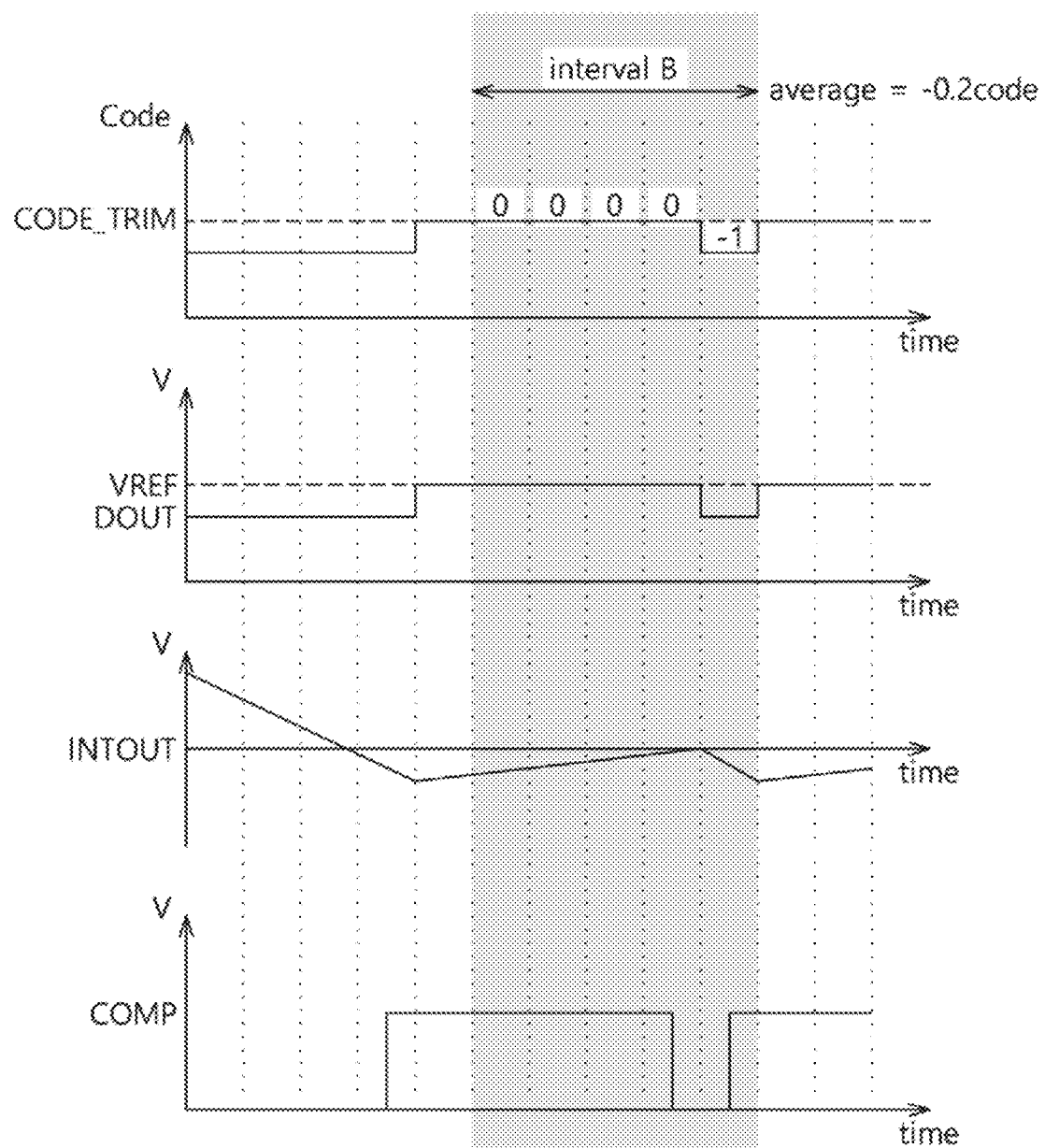
Figure 12:
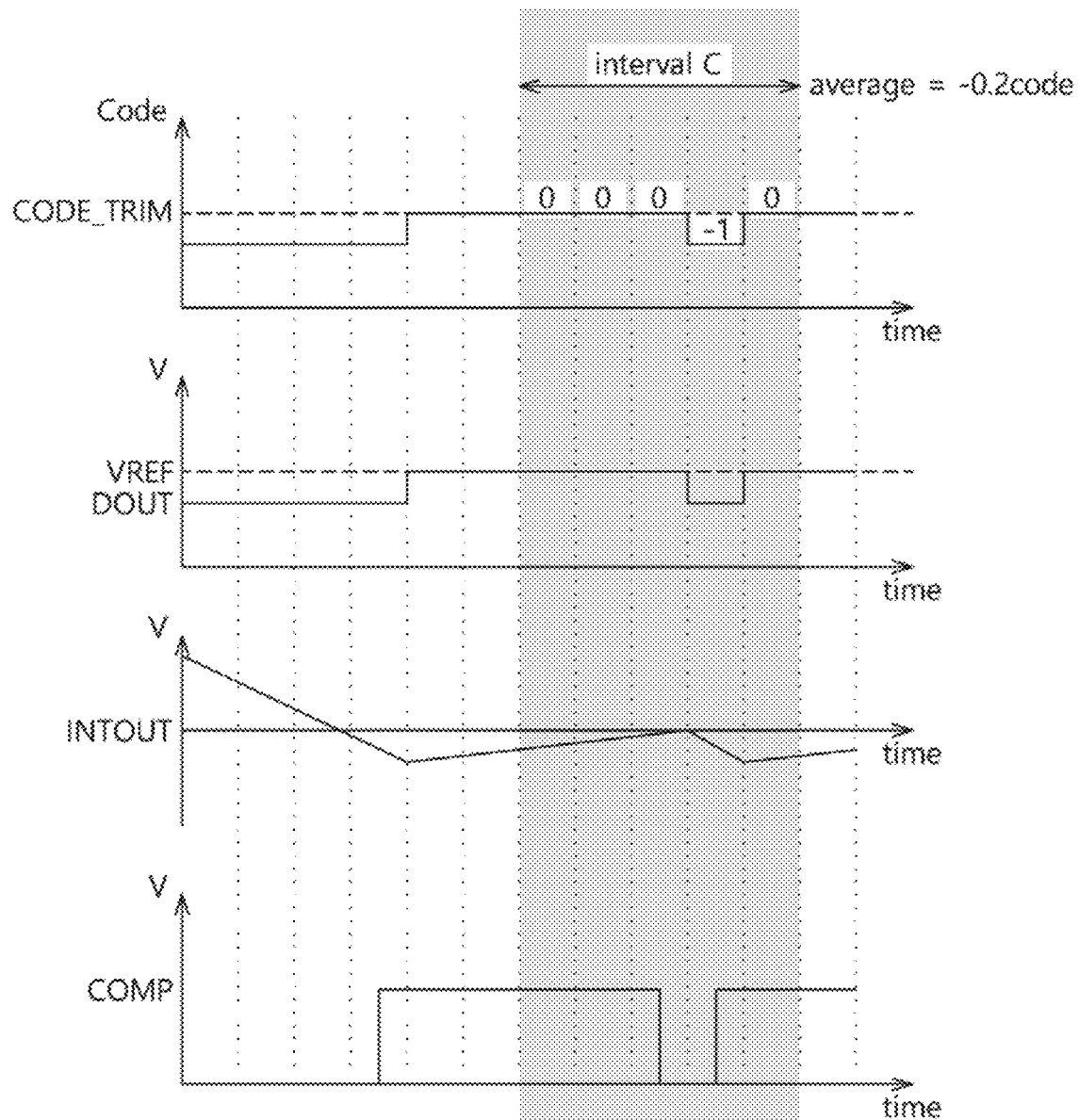

FIGS. 10 to 12 are timing diagrams for describing trimming code generating methods according to embodiments.

Referring to FIG. 10, for the interval A after the transition detection of the comparison signal COMP, the trimming code CODE_TRIM may be averaged and an average 0 (zero) code may be calculated.

It can be seen from FIGS. 11 and 12 that the trimming code CODE_TRIM is averaged in the respective intervals B and C and −0.2 code is calculated. Because −0.5 code or less might not be rounded to and may be neglected when the code is averaged and thus the error code might not be caused.

As a result, even when the code is averaged for a short interval, the reliable trimming code may be obtained and a circuit size due to calculation simplification may be reduced or minimized.

Figure 13:
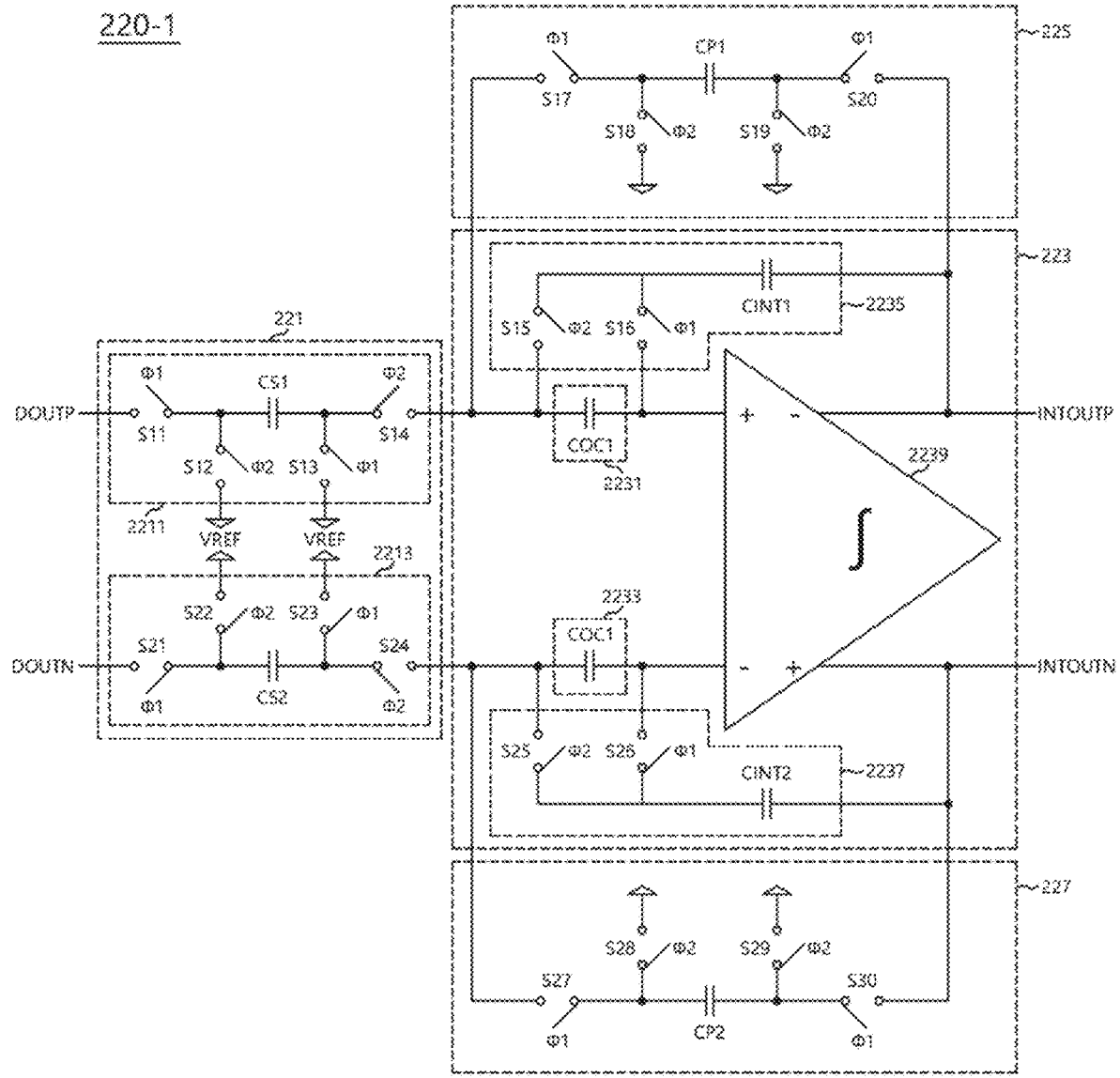
FIG. 13 is a diagram illustrating a configuration of an integration circuit according to an embodiment of the present disclosure.

FIG. 13 is a diagram illustrating a configuration of an integration circuit 220-1 according to an embodiment.

Referring to FIG. 13, the integration circuit 220-1 may further include a first pole addition unit 225 coupled between the first sampling unit 2211 and the negative (−) output terminal INTOUTP of the amplification unit 2239 and a second pole addition unit 227 coupled between the second sampling unit 2213 and the positive (+) output terminal INTOUTN of the amplification unit 2239.

The first pole addition unit 225 may include a first pole switch S17 coupled to the first sampling unit 2211 and driven in response to the first control signal φ1, a second pole switch S18 coupled between the first pole switch S17 and a ground terminal and driven in response to the second control signal φ2, a first pole capacitor CP1 of which one terminal is coupled to the second pole switch S18, a third pole switch S19 coupled between the other terminal of the first pole capacitor CP1 and the ground terminal and driven in response to the second control signal φ2, and a fourth pole switch S20 coupled between the other terminal of the first pole capacitor CP1 and the negative (−) output terminal INTOUTP of the amplification unit 2239.

The second pole addition unit 227 may include a fifth pole switch S27 coupled to the second sampling unit 2213 and driven in response to the first control signal φ1, a sixth pole switch S28 coupled between the fifth pole switch S27 and the ground terminal and driven in response to the second control signal φ2, a second pole capacitor CP2 of which one terminal is coupled to the sixth pole switch S28, a seventh pole switch S29 coupled between the other terminal of the second pole capacitor CP2 and the ground terminal and driven in response to the second control signal φ2, and a eighth pole switch S30 coupled between the other terminal of the second pole capacitor CP2 and the positive (+) output terminal INTOUTN of the amplification unit 2239.

The integration circuit 220-1 illustrated in FIG. 13 may add the pole to the output signals (e.g., INTOUTP and INTOUTN) and feedback the pole-added output signals to the input terminals (e.g., DOUTP and DOUTN. Accordingly, the levels of the output signals of the integration circuit 220-1 may be formed near the level of the reference voltage VREF which is a common mode voltage and thus the fluctuation of the trimming code may be minimized.

Capacitances of the pole capacitors CP1 and CP2 may be selected as values which satisfy the desired poles.

Figure 14:
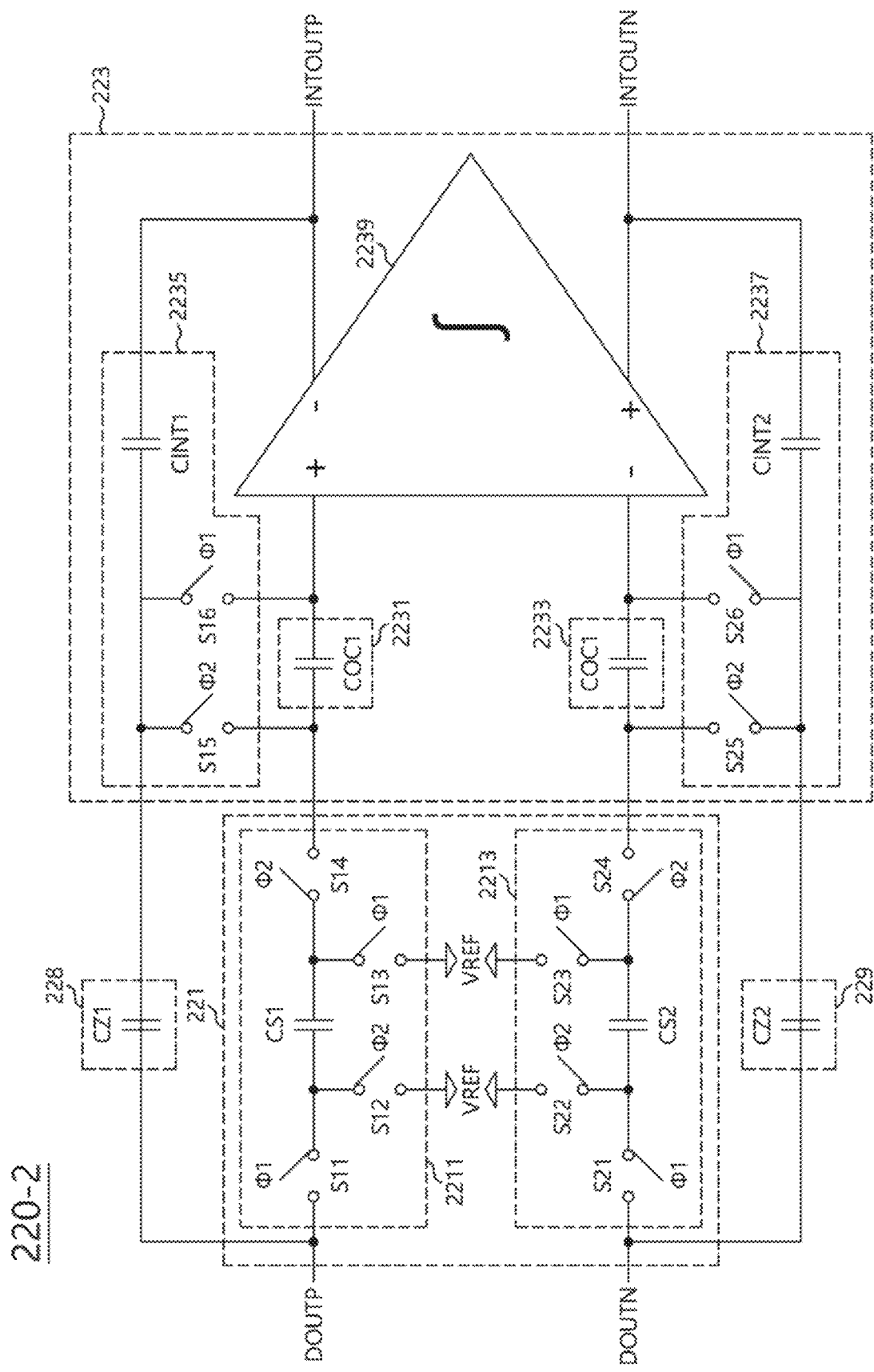
FIG. 14 is a diagram illustrating a configuration of an integration circuit according to an embodiment of the present disclosure.

FIG. 14 is a diagram illustrating a configuration of an integration circuit 220-2 according to an embodiment.

Referring to FIG. 14, the integration circuit 220-2 may further include a first zero addition unit 228 and a second zero addition unit 229 in addition to the components of the integration circuit 220 illustrated in FIG. 4.

The first zero addition unit 228 may include a first zero capacitor CZ1 coupled between the input terminal DOUTP of the first sampling unit 2211 and the first integration unit 2235.

The second zero addition unit 229 may include a second zero capacitor CZ2 coupled between the input terminal DOUTN of the second sampling unit 2213 and the second integration unit 2237.

The present technology may allow the response characteristic of the integration circuit 220-2 to converge near the level of the reference level VREF, in the interval for which the phase of the first control signal φ1 is a high level, through the first and second zero addition units 228 and 229 and thus may minimize the fluctuation rate of the trimming code CODE_TRIM.

The above described embodiments of the present teachings are intended to illustrate and not to limit the present teachings. Various alternatives and equivalents are possible. The present teachings not limited by the embodiments described herein. Nor are the present teachings limited to any specific type of semiconductor device. Other additions, subtractions, or modifications are obvious in view of the present disclosure and are intended to fall within the scope of the appended claims.

What is claimed is:

1. A data storage apparatus comprising:
   storage; and
   a controller configured to control the storage in response to a request from a host,
   wherein the controller comprises an internal voltage trimming circuit, and
   wherein the internal voltage trimming circuit comprises:
      an integration circuit configured to generate an integration signal by integrating a difference between a test voltage output from a device under test (DUT) and a reference voltage;
      a comparison circuit configured to generate a comparison signal by comparing the integration signal and the reference voltage;

a transition detection circuit configured to output a detection signal in response to level transition of the comparison signal;

a counter configured to receive an initial trimming code and generate a preliminary trimming code by increasing or reducing the initial trimming code in response to the detection signal; and an average circuit configured to generate a final trimming code by averaging the preliminary trimming code for a determined time interval and provide the final trimming code to the storage.

2. The data storage apparatus of claim 1, wherein the integration circuit comprises an offset cancellation unit configured to sample the difference between the test voltage and the reference voltage and generate the integration signal by integrating a sampling signal, wherein the offset cancellation unit is further configured to remove an offset from the sampling signal.

3. The data storage apparatus of claim 2, wherein the integration circuit further comprises a pole addition unit configured to allow an output level of the integration signal to converge to a level of the reference voltage during the sampling of the difference between the test voltage and the reference voltage.

4. The data storage apparatus of claim 2, wherein the integration circuit further comprises a zero addition unit configured to allow an output level of the integration signal to converge to a level of the reference voltage during the sampling of the difference between the test voltage and the reference voltage.

5. The data storage apparatus of claim 2, wherein the integration circuit comprises:

a first sampling unit configured to receive a first input signal generated from the test voltage and sample a difference between the first input signal and the reference voltage in response to a first control signal and a second control signal having phases such that high level intervals are alternately repeated and non-overlapping;

a first offset cancellation unit coupled to an output terminal of the first sampling unit;

a second sampling unit configured to receive a second input signal which is generated from the test voltage as a differential signal of the first input signal and sample a difference between the second input signal and the reference voltage in response to the first control signal and the second control signal;

a second offset cancellation unit coupled to an output terminal of the second sampling unit, wherein the offset cancellation unit comprises the first and second offset cancellation unit;

an amplification unit configured to output a first integration signal by receiving and amplifying an output signal of the first offset cancellation unit and output a second integration signal by receiving and amplifying an output signal of the second offset cancellation unit;

a first integration unit coupled between the output terminal of the first sampling unit and an output terminal of the first integration signal; and a second integration unit coupled between the output terminal of the second sampling unit and an output terminal of the second integration signal.

6. The data storage apparatus of claim 5, wherein the integration unit further comprises:

a first pole addition unit coupled between the output terminal of the first sampling unit and the output terminal of the first integration signal; and a second pole addition unit coupled between the output terminal of the second sampling unit and the output terminal of the second integration signal.

7. The data storage apparatus of claim 5, wherein the integration unit further comprises:

a first zero addition unit coupled between an input terminal of the first sampling unit and the first integration unit; and a second zero addition unit coupled between an input terminal of the second sampling unit and the second integration unit.

8. An internal voltage trimming circuit configured to provide a trimming code for generating an internal voltage of a semiconductor device, wherein the internal voltage trimming circuit comprises:

an integration circuit configured to generate an integration signal by integrating a difference between a test voltage output from a device under test (DUT) and a reference voltage;

a comparison circuit configured to generate a comparison signal by comparing the integration signal and the reference voltage;

a transition detection circuit configured to output a detection signal in response to level transition of the comparison signal;

a counter configured to receive an initial trimming code and generate a preliminary trimming code by increasing or reducing the initial trimming code in response to the detection signal; and an average circuit configured to generate a final trimming code by averaging the preliminary trimming code for a determined time interval and provide the final trimming code to the semiconductor device.

9. The internal voltage trimming circuit of claim 8, wherein the integration circuit comprises an offset cancellation unit configured to sample the difference between the test voltage and the reference voltage and generate the integration signal by integrating a sampling signal, wherein the offset cancellation unit is further configured to remove an offset from the sampling signal.

10. The internal voltage trimming circuit of claim 9, wherein the integration circuit further comprises a pole addition unit configured to allow an output level of the integration signal to converge to a level of the reference voltage during the sampling of the difference between the test voltage and the reference voltage.

11. The internal voltage trimming circuit of claim 9, wherein the integration circuit further comprises a zero addition unit configured to allow an output level of the integration signal to converge to a level of the reference voltage during the sampling of the difference.

12. The internal voltage trimming circuit of claim 9, wherein the semiconductor device is a storage apparatus configured to input and output data according to control of a controller, and wherein the internal voltage trimming circuit is embedded in the controller as a built-in self-test (BIST) device.

13. A trimming method performed by an internal voltage trimming to circuit for generating an internal voltage of a semiconductor device, the method comprising:

generating an integration signal by integrating a difference between a test voltage output from a device under test (DUT) and a reference voltage;

generating a comparison signal by comparing the integration signal and the reference voltage;

outputting a detection signal in response to level transition of the comparison signal;

generating a preliminary trimming code by increasing or reducing an initial trimming code in response to the detection signal; and generating a final trimming code by averaging the preliminary trimming code for a determined time interval and providing the final trimming code to the semiconductor device.

14. The method of claim 13, wherein integrating a difference between a test voltage output from a DUT and a reference voltage comprises:

sampling the difference between the test voltage and the reference voltage; and removing an offset from a sampling signal; and generating the integration signal by integrating the offset-removed sampling signal.

15. The method of claim 14, wherein integrating a difference between a test voltage output from a DUT and a reference voltage further comprises allowing an output level of the integration signal to converge to a level of the reference level during the sampling of the difference.

* * * * *